(12) United States Patent
Delvecchio et al.

(10) Patent No.: US 6,625,552 B1
(45) Date of Patent: Sep. 23, 2003

(54) BATTERY FUEL GAUGE FOR DISPLAY IN BATTERY-POWERED EQUIPMENT

(75) Inventors: Karen S. Delvecchio, Glendale, WI (US); Michael J. Palmer, Greenfield, WI (US); James M. Gray, Fox Point, WI (US); David L. Schieble, Oconomowoc, WI (US)

(73) Assignee: General Electric Company, Waukesha, WI (US)

( * ) Notice: Subject to any disclaimer, the term of this patent is extended or adjusted under 35 U.S.C. 154(b) by 0 days.

(21) Appl. No.: 09/438,171

(22) Filed: Nov. 11, 1999

Related U.S. Application Data

(63) Continuation-in-part of application No. 09/435,164, filed on Nov. 5, 1999, now Pat. No. 6,191,557.

(51) Int. Cl.⁷ .............................................. G01R 19/00
(52) U.S. Cl. ....................................... 702/63; 320/132
(58) Field of Search .............................. 702/63, 64, 65, 702/66, 67, 68, 57, 117, 118, 120, 122, 124, 126, 179, 180, 182; 340/636; 365/183; 324/427, 428; 320/131, 107, 112, 106, 132, 134, 136, 137, 168

(56) References Cited

U.S. PATENT DOCUMENTS

| | | | | |
|---|---|---|---|---|
| 4,553,081 A | * | 11/1985 | Koenck | 320/131 |
| 4,709,202 A | * | 11/1987 | Koenck et al. | 320/112 |
| 5,349,535 A | * | 9/1994 | Gupta | 702/63 |
| 5,578,915 A | * | 11/1996 | Crouch, Jr. et al. | 324/428 |
| 5,600,230 A | * | 2/1997 | Dunstan | 340/636 |
| 5,764,034 A | | 6/1998 | Bowman et al. | 320/155 |
| 5,796,239 A | * | 8/1998 | Van Phuoc et al. | 320/107 |
| 5,809,449 A | * | 9/1998 | Harper | 702/63 |
| 5,919,141 A | | 7/1999 | Money et al. | 600/513 |
| 5,955,869 A | * | 9/1999 | Rathmann | 320/132 |
| 5,982,147 A | * | 11/1999 | Anderson | 320/132 |
| 6,061,638 A | | 5/2000 | Joyce | 702/63 |
| 6,157,169 A | * | 12/2000 | Lee | 320/132 |
| 6,169,387 B1 | * | 1/2001 | Kaib | 320/132 |
| 6,181,103 B1 | * | 1/2001 | Chen | 320/106 |
| 6,191,557 B1 | * | 2/2001 | Gray et al. | 320/132 |

* cited by examiner

*Primary Examiner*—Hal Wachsman
*Assistant Examiner*—Mohamed Charioui
(74) *Attorney, Agent, or Firm*—Ostrager Chong & Flaherty LLP

(57) ABSTRACT

A method and an apparatus for informing a system user that the full charge capacity of the battery is less than the design capacity. One horizontal fuel gauge icon for each battery is displayed on the host system display panel. The fuel gauge is displayed as three overlapping rectangles which are left justified. The first layer is a dashed outline, always the same width, representing the design capacity of the battery. The second layer is a solid outline representing the full capacity as a percentage of the design capacity. As a battery wears, this level will become a smaller percentage of the full rated capacity indicated by the dashed line. The third layer is a filled rectangle representing the present (actual) capacity as a percentage of the full capacity.

23 Claims, 4 Drawing Sheets

BATTERY FUEL GAUGE FOR DISPLAY IN BATTERY-POWERED EQUIPMENT

RELATED PATENT APPLICATION

This application is a continuation-in-part application claiming priority from and the benefit of the filing date of U.S. patent application Ser. No. 09/435,164 filed on Nov. 5, 1999, and issued on Feb. 20, 2001 as U.S. Pat. No. 6,191,557.

FIELD OF THE INVENTION

This invention generally relates to portable battery-powered equipment. In particular, the invention relates to methods and apparatus for displaying a fuel gauge icon representing the state of a battery in battery-powered equipment.

BACKGROUND OF THE INVENTION

When providing medical care to patients, it is frequently necessary to monitor the patient using medical diagnostic instruments. One type of instrument, the patient monitor, is capable of monitoring the patient to acquire electrocardiogram data, cardiac output data, respiration data, pulse oximetry data, blood pressure data, temperature data and other parameter data. In particular, lightweight portable monitors exist which can be moved with the patient, allowing continuous monitoring during patient transport.

To facilitate monitoring at remote locations or during patient transport, modern portable patient monitors are powered by rechargeable batteries. Extended-use batteries, with quick recharge times, help maximize monitor availability. Advanced monitors have a smart battery management system which maximizes battery life, reducing maintenance and replacement. Such monitors use smart batteries which can be interrogated to obtain data representing the ongoing state of the battery, e.g., the current charge capacity and battery terminal voltage.

Portable patient monitors with integral battery power supply are commercially available in a compact, ergonomic package which allows easy handling. The compact design is achieved in part through the use of flat display panels. The color or monochrome screen accommodates all numerics and multiple waveforms.

In addition to displaying waveforms and numerics representing the data being acquired, advanced patient monitors are able to display a battery fuel gauge icon representing the current charge capacity of a battery. For example, the battery fuel gauge may display a rectangle of pixels having a width proportional to the percentage of the full charge capacity (assumed to be equal to the design capacity) which remains in the battery. If the full width of the displayed fuel gauge is 75 pixels and the charge remaining is 20% of the full charge capacity, then the current charge state can be depicted by displaying a rectangle on the gauge having a width equal to 15 pixels (i.e., 20% of 75 pixels).

Users of portable battery-powered equipment need to have a dependable means of determining the present condition (state of charge) of the batteries installed in the system. As batteries age, they become chemically worn out and unable to attain their design charge capacity during recharging. In the situation where the full charge capacity is less than the design charge capacity, the system user may think that the remaining run time is greater than what actually remains. The problem posed by the foregoing situation is how to represent the charge level of the battery accurately without misrepresenting the estimated run time remaining. For example, given two batteries that are both reporting that they are full (i.e., unable to take any more charge), one may last one hour and the other may last two hours.

Thus there is a need for a method of informing the system user that the battery, although full, may not last as long as a newer or more recently conditioned or calibrated full battery.

SUMMARY OF THE INVENTION

The present invention is a method and an apparatus for informing a system user that the full charge capacity of the battery is less than the design capacity. The preferred embodiment involves adding a layer of detail, namely, the design charge capacity, to the conventional bar graph fuel gauge icon. One horizontal fuel gauge icon for each battery is displayed on the host system display panel. In accordance with the preferred embodiment, the fuel gauge is displayed as three overlapping rectangles which are left justified. The first layer is a dashed outline, always the same width, representing the design charge capacity of the battery. The second layer is a solid outline representing the full charge capacity as a percentage of or in proportion to the design charge capacity. As a battery wears, this level will become a smaller percentage of the full rated capacity indicated by the dashed line. The third layer is a filled rectangle representing the present (actual) charge capacity as a percentage of or in proportion to the full charge capacity.

In accordance with the preferred embodiment, a central processing unit (CPU) of a patient monitor interrogates a microprocessor of a smart battery via a serial data bus to obtain feedback concerning the design, full and current charge capacities of that battery. The charge capacity values are stored in registers in the smart battery microprocessor. Using the polled information, the host system CPU constructs a fuel gauge having indicators representing the respective charge capacities. The newly constructed fuel gauge is then sent to the display controller, which causes the desired fuel gauge icon to be displayed on the display panel.

The invention is preferably implemented completely in software. However, the person skilled in the art will readily appreciate that the invention could also be implemented as hardware or as a dedicated programmable processor. As used in the claims, the term "fuel gauge processor" encompasses a CPU programmed with software, hardware or a dedicated programmed processor for performing the fuel gauge display function disclosed herein. The term "fuel gauge processor" also encompasses multiple processors having different functions, for example, one processor for processing acquired data representing the charge capacity of a battery and another processor for processing graphical data representing a bar graph fuel gauge for display based on the acquired data.

Furthermore, although the preferred embodiment disclosed herein is incorporated in a battery-powered portable patient monitor, the invention has application in any battery-powered equipment having a processor and a display panel. The invention could even be incorporated into a smart battery pack having a display device, which need only be large enough to display a bar graph fuel gauge icon. Such a smart battery pack would be particularly useful in battery-powered equipment which does not have a display panel.

DETAILED DESCRIPTION OF THE PREFERRED EMBODIMENTS

Although the present invention is directed to a method and an apparatus for displaying a fuel gauge icon in any battery-powered equipment having display means, the preferred embodiment is disclosed with reference to a portable patient monitor. A general description of the structure and function of such a patient monitor is provided for the sake of completeness.

Figure 1:
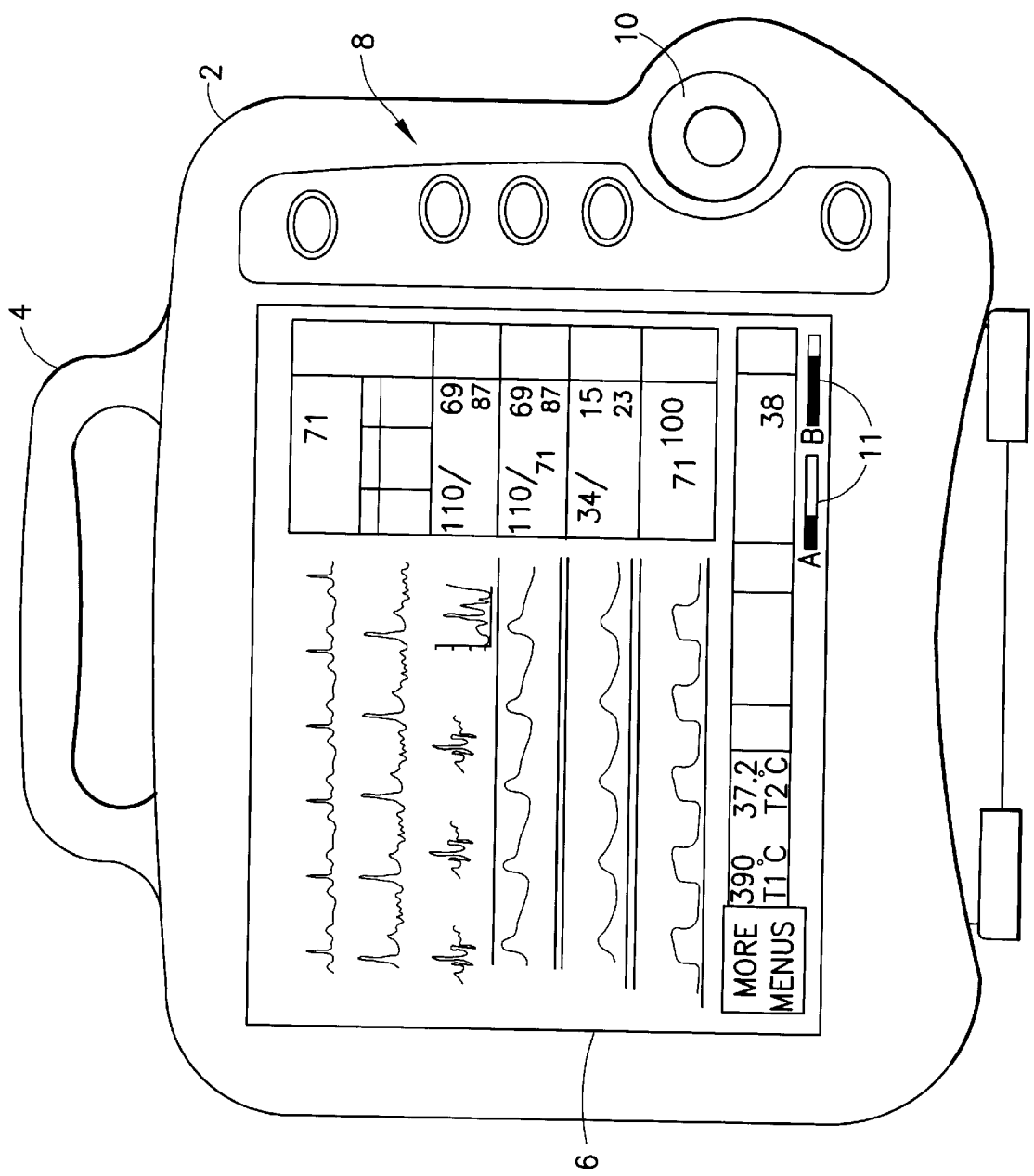
FIG. 1 is a drawing showing a generally frontal view of one commercially available portable patient monitor having a conventional bar graph fuel gauge icon displayed on its display panel.
Figure 2:
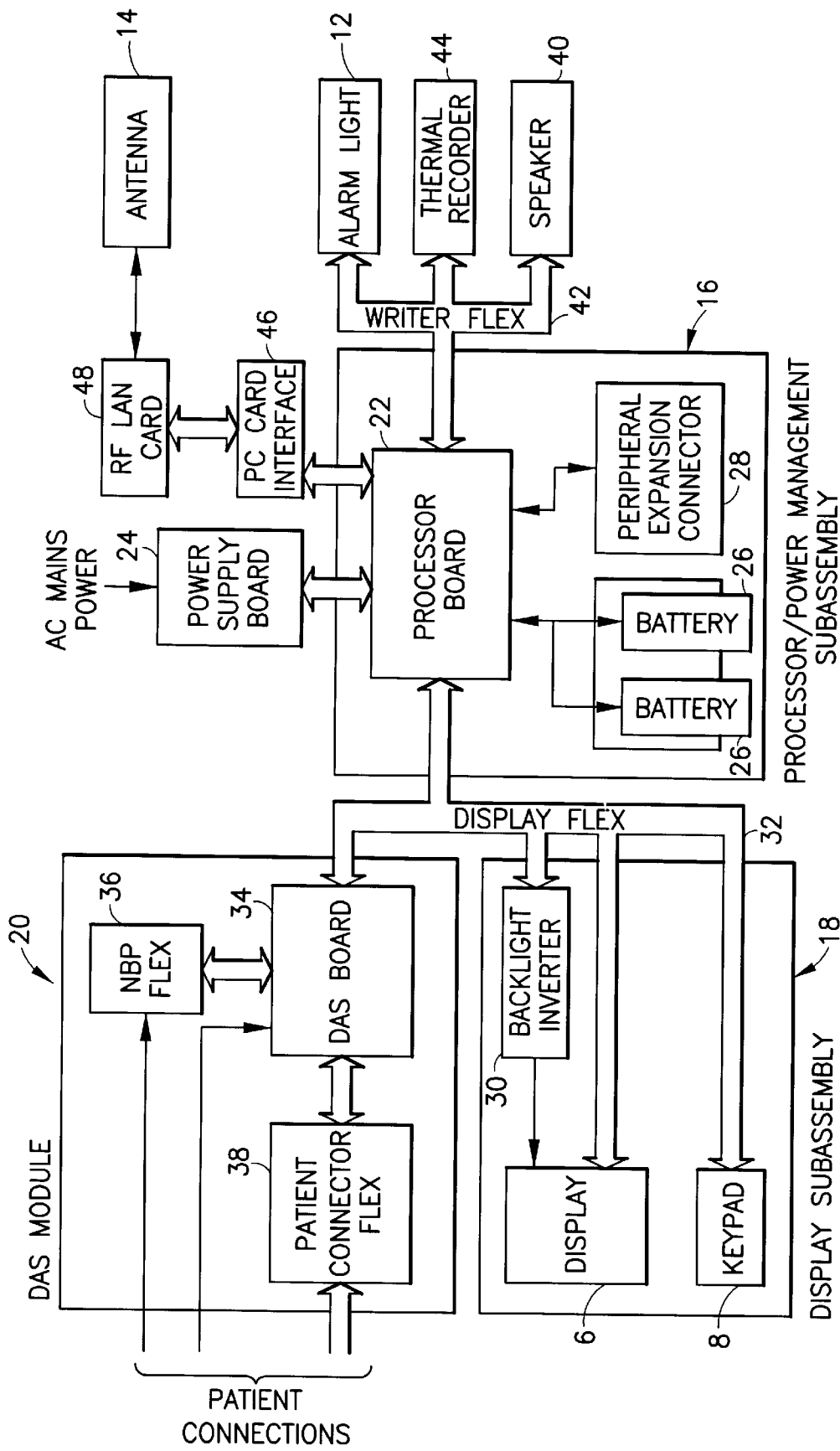
FIG. 2 is a block diagram showing the construction of one type of patient monitor in which the present invention can be incorporated.

A known portable patient monitor, depicted in FIGS. 1 and 2, comprises a housing 2 and a handle 4 connected to the top of the housing. A flat display panel 6 is secured in a generally rectangular window formed in the front face of the housing 2. An operator interface comprising a plurality of keys, forming a keypad 8, and a so-called "trim" knob 10, which allows the user to select and focus on a particular menu. The display panel 6 displays waveforms and numerical data. The status of a pair of batteries A and B is respectively indicated by a pair of bar graph fuel gauge icons 11 in the lower right-hand corner of the display panel 6. The conventional bar graph fuel gauge icon displays a first layer comprising a solid outline representing the full charge capacity and a second layer comprising a filled-in rectangle representing the current charge capacity. The design charge capacity is not indicated.

The portable battery-powered patient monitor shown in FIG. 1 incorporates two smart batteries, as indicated by the corresponding fuel gauge icons. However, the present invention can be used in conjunction with a single smart battery or more than two batteries. A separate fuel gauge icon in accordance with the preferred embodiment will be displayed for each smart battery in place of the conventional fuel gauge icons depicted in FIG. 1. As used herein, the term "smart battery" means a subsystem comprising a dc voltage source and at least one register for storing a parameter value (e.g., charge capacity) of that dc voltage source.

Referring to FIG. 2, the patient monitor comprises a processor/power management subassembly 16, a display subassembly 18 and a data acquisition system module 20.

The processor/power management subassembly 16 comprises a processor board 22 which can be powered by an ac mains power supply via a power supply board 24. Alternatively, the processor board 22 can be powered by rechargeable smart batteries 26 when the patient monitor is disconnected from the mains power supply, e.g., during patient transport. The processor/power management subassembly 16 further comprises a peripheral expansion connector 28, which allows the processor to communicate with peripheral processors added as the result of future expansion of the system.

The display subassembly 18 comprises a liquid-crystal display (LCD) flat panel 6, a backlight inverter 30 for powering the fluorescent tubes of the flat display panel and a keypad 8 for operator inputs. The flat display panel 6, the backlight inverter 30 and the keypad 8 are electrically coupled to the processor board 22 via a display flexible printed circuit board (flex) 32.

The data acquisition system (DAS) module 20 comprises a plurality of ports for patient connections and a DAS board 34. The patient connection for acquiring noninvasive blood pressure (NBP) data is coupled to the DAS board 34 via an NBP flex 36. The leads for acquiring electrocardiogram (ECG), respiratory and other cardiovascular data are coupled to the DAS board 34 via a patient connector flex 38. The ECG leads connect to electrodes attached to the patient's chest. The acquired data is sent to the processor board 22 for signal processing and analysis via the display flex 32. The processor board 22 controls the display panel 6 to display the desired waveforms and numerical data based on the acquired data received from the DAS board 34.

In addition to displaying acquired data, the patient monitor depicted in FIG. 2 also has the capability of automatically activating audible and visual alarms in response to acquired data exceeding a preset alarm threshold. The alarm thresholds are user-selectable via keypad entries. The visual alarm indicator is an alarm light 12 which flashes when activated; the audible indicator is an audio speaker 40 which emits alarm tones when activated. The alarm light 12 and audio speaker 40 are controlled by the processor board 22 via a writer flex 42. The processor board 22 also controls a thermal recorder 44 via the writer flex 42. The thermal recorder 44 serves to create a written record of selected data readings.

Also the patient monitor can communicate wirelessly with a local area network (LAN) using an antenna 14. The processor board 22 sends signals to and receives signals from the antenna 14 via a PC card interface 46 which interfaces with a RF LAN card 48. The PC card interface 46 plugs into a socket which resides on the processor board 22.

As previously described, the patient monitor shown in FIGS. 1 and 2 has two smart batteries 26. In accordance with the preferred embodiment of the invention, a respective fuel gauge icon 11 (see FIG. 1) is displayed on the display panel 6 for each battery. These icons are labeled A and B to designate the respective batteries. During operation in the battery mode, if neither battery is in a so-called "soft" condition, then initially the patient monitor will receive dc voltage from the battery with the least charge. As used herein, the term "soft" condition means that the battery voltage has reached or crossed a threshold voltage level which is more than the shutdown voltage by a predetermined amount. (The shutdown voltage is the voltage at which the smart battery issues an alarm signal and resets its charge capacity register to zero to indicate that the battery is fully discharged.) To identify a battery entering the "soft" condition, the system CPU detects when the battery terminal voltage declines to a battery soft voltage threshold that is on the "knee" of the battery discharge voltage characteristic curve. This point also has an approximate equipment remaining run time value associated with it. When the battery currently supplying power becomes "soft", the host system switches to the other battery. When the other battery also becomes "soft", the host system recouples to the first battery while maintaining its coupling to battery B. The host system shuts down upon receipt of shutdown alarm signals from both batteries.

The present invention provides a method and means for displaying graphical information representing the full charge capacity of the battery as a percentage of or in proportion to the design charge capacity, while also displaying graphical information representing the current charge capacity of the battery as a percentage of or in proportion to the full charge capacity. In the preferred embodiment shown in FIG. 3, the host system 50 (e.g., a patient monitor of the type shown in FIGS. 1 and 2) receives dc voltage from the battery cells 52 of a smart battery. The smart battery further comprises a parameter sensing circuit 54 for acquiring analog signals representing various parameters of the battery cells, such as current charge capacity and battery terminal voltage; a signal conditioning circuit 55 for conditioning the signals output by the parameter sensing circuit 54; an analog-to-digital (A/D) converter 56 for converting the analog values from the signal conditioning circuit 55 into digital values; and a microprocessor 58 which has registers for storing the full and current charge capacity values and the battery terminal voltage from the A/D converter 56. The microprocessor 58 also has a register for storing a design charge capacity value which is pre-stored in the microprocessor by the smart battery manufacturer. In accordance with the preferred embodiment of the invention, the host system 50 periodically interrogates the microprocessor 58 via a two-wire (one data line and one clock line) serial data bus 59. In response to such interrogation, the smart battery microprocessor 58 reads out the design, full and current charge capacity values stored in its internal registers and transmits those values to the host system 50 via the same serial data bus 59.

Figure 4:
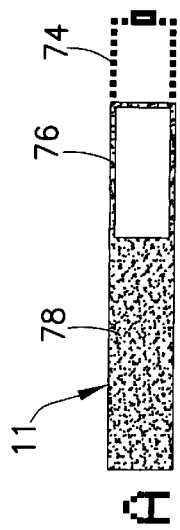
FIG. 4 is a schematic showing a bar graph fuel gauge icon as it would appear on a display panel in accordance with the preferred embodiments of the invention.

Based on the battery-specific parameters received from the interrogated microprocessor, the host system then constructs a fuel gauge icon and displays it on the display panel to represent the current status of the battery. The preferred embodiment of the fuel gauge icon, as displayed, is depicted in FIG. 4 for battery A. A similarly constructed fuel gauge icon is displayed for battery B. The fuel gauge 11 is displayed as three overlapping rectangles which are left justified. The first layer is a dashed outline 74, always the same width, representing the design charge capacity of the battery. The second layer is a solid outline 76 representing the full charge capacity as a percentage of or in proportion to the design charge capacity. As a battery wears, this level will become a smaller percentage of the full rated capacity indicated by the dashed line. The third layer is a filled rectangle 78 representing the present (actual) charge capacity as a percentage of or in proportion to the full charge capacity. In accordance with the preferred embodiment, the filled-in rectangle 78 has a width equal to a number of pixels roughly proportional to said current charge capacity, the solid line 76 is separated from the left side (as viewed in FIG. 4) of the filled-in rectangle by a number of pixels roughly proportional to the full charge capacity and the dashed line is separated from the left side of the filled-in rectangle by a number of pixels roughly proportional to the design charge capacity. For example, assume that the dashed rectangle representing the design charge capacity is 75 pixels wide. Then, if the full charge capacity is 80% of the design charge capacity, the solid outline 76 (which is superimposed on the 75-pixel-wide dashed rectangle 74) will be 60 pixels wide. Similarly, if the current charge capacity is 60% of the full charge capacity, the filled-in rectangle 78 (which is superimposed on the 60-pixel-wide solid rectangle 74) will be 36 pixels wide.

Figure 3:
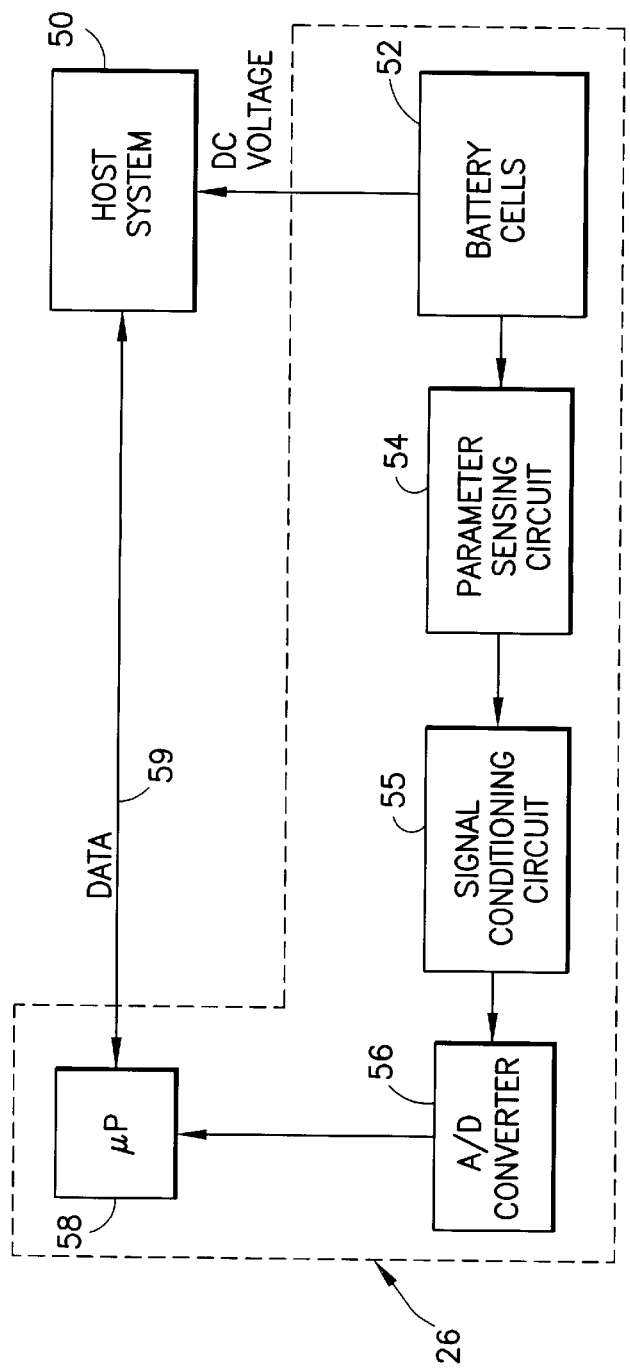
FIG. 3 is a block diagram generally depicting a conventional smart battery connected to a host system such as the patient monitor of FIG. 2.
Figure 5:
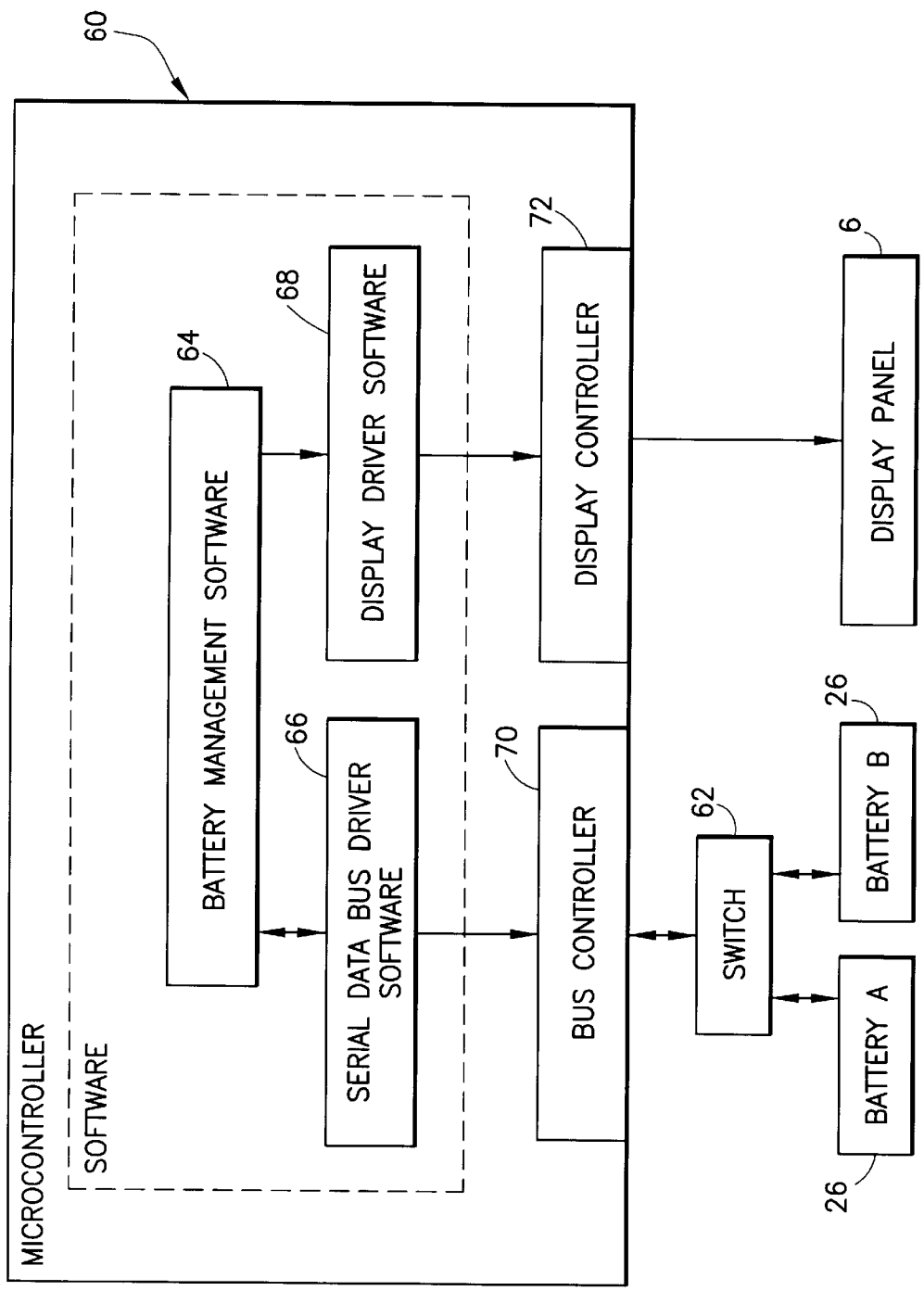
FIG. 5 is a block diagram showing parts of a battery-powered patient monitor in accordance with a preferred embodiment of the invention.

In accordance with the preferred embodiment shown in FIG. 5, the host system is powered by a pair of smart batteries of the type generally depicted in FIG. 3. Preferably the host system has a central processing unit (CPU) 60 (e.g., a microcontroller) which is programmed to perform the steps of interrogating each battery to obtain its design charge capacity, its full charge capacity and its current charge capacity; and then controlling the display panel to display a fuel gauge icon comprising respective indicators representing the design charge capacity, full charge capacity and current charge capacity retrieved from each battery. The CPU 60 interrogates each battery 26 via a two-wire serial data bus which incorporates a switch 62. In a first switch state, the CPU 60 interrogates battery A via switch 62; in a second switch state, the CPU 60 interrogates battery B via switch 62. The CPU 60 is programmed with battery management software 64 which interrogates the smart batteries and then constructs the fuel gauge icons to be displayed on the display panel. The interrogation of the batteries is facilitated by serial data bus driver software 66, which controls operation of a built-in bus controller 70 of the CPU 60. Preferably, the serial data bus driver software 66 and bus controller 70 conform to the I2C protocol, which is an industry standard. The two-wire serial data bus, known as the SMBus, is an extension of the I2C bus and is also an industry standard.

The design charge capacity, full charge capacity and current charge capacity are battery-specific parameters maintained within each battery 26. The battery management software 64 merely issues a request for these values and receives a response from the interrogated battery, all via the SMBus. Then the fuel gauge icon is constructed by the battery management software 64 and sent to the display panel 6. The battery management software 64 draws each fuel gauge icon by drawing three different rectangles (a dashed outline, a solid outline and a filled-in rectangle respectively representing the design charge capacity, the full charge capacity and the current charge capacity), left justified and superimposed on one other. The battery management software 64 is responsible for recalculating the size of each rectangle every second based on new data from the battery. The battery management software then sends these sizes to the display driver software 68, which uses the built-in display controller 72 of the CPU 60.

While the invention has been described with reference to preferred embodiments, it will be understood by those skilled in the art that various changes may be made and equivalents may be substituted for elements thereof without departing from the scope of the invention. For example, it is obvious to a person skilled in the art that a solid or dashed line can be used to indicate the current charge capacity on the fuel gauge icon, instead of a filled-in rectangle. In this case, the solid or dashed line would be situated at the same position as the right side of the filled-in rectangle 78 shown in FIG. 5. Nor does the invention require that the fuel gauge icon be constructed using rectangles. Other geometric shapes can also be used. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

What is claimed is:

1. An apparatus comprising:

a smart battery comprising a battery and memory for storing a first value representing a design charge capac ity and a second value representing a full charge capacity of said battery;

a display panel; and a processor for controlling said display panel to display a gauge comprising a first indicator representing said first value and a second indicator representing said second value.

2. The apparatus as recited in claim 1, wherein said memory of said smart battery stores a third value representing a current charge capacity of said battery, and said gauge further comprises a third indicator representing said third value.

3. The apparatus as recited in claim 2, wherein said gauge comprises a bar graph, said first indicator comprises a dashed line on said bar graph, said second indicator comprises a solid line on said bar graph and said third indicator comprises a filled-in rectangle.

4. The apparatus as recited in claim 3, wherein said filled-in rectangle has a width equal to a number of pixels roughly proportional to said current charge capacity, said solid line is separated from a side of said filled-in rectangle by a number of pixels roughly proportional to said full charge capacity and said dashed line is separated from said side of said filled-in rectangle by a number of pixels roughly proportional to said design charge capacity.

5. The apparatus as recited in claim 2, wherein said first indicator comprises a portion of a dashed rectangle, said second indicator comprises a portion of a solid rectangle and said third indicator comprises a filled-in rectangle.

6. The apparatus as recited in claim 1, wherein said first indicator comprises a portion of a dashed rectangle and said second indicator comprises a portion of a solid rectangle.

7. The apparatus as recited in claim 1, wherein said gauge comprises a bar graph, said first and second indicators comprising a dashed line and a solid line respectively on said bar graph, said first and second indicator being generally parallel.

8. The apparatus as recited in claim 1, further comprising means for interrogating said smart battery and means for acquiring said first and second values subsequent to said interrogation.

9. The apparatus as recited in claim 1, further comprising:

a housing in which said display panel is seated;

a data acquisition system located within said housing; and a data processor located within said housing and coupled to receive acquired data from said data acquisition system and display said acquired data from said data acquisition system on said display panel.

10. An apparatus comprising:

a battery having a design charge capacity, a full charge capacity and a current charge capacity;

a display panel; and a computer programmed to perform the steps of controlling said display panel to display a gauge, said gauge comprising a first indicator representing said design charge capacity of said battery, a second indicator representing said full charge capacity of said battery and a third indicator representing said current charge capacity of said battery.

11. The apparatus as recited in claim 10, wherein said gauge comprises a bar graph, said first indicator comprises a dashed line on said bar graph, said second indicator comprises a solid line on said bar graph and said third indicator comprises a filled-in rectangle on said bar graph.

12. The apparatus as recited in claim 11, wherein said filled-in rectangle has a width equal to a number of pixels roughly proportional to said current charge capacity, said solid line is separated from a side of said filled-in rectangle by a number of pixels roughly proportional to said full charge capacity and said dashed line is separated from said side of said filled-in rectangle by a number of pixels roughly proportional to said design charge capacity.

13. The apparatus as recited in claim 10, wherein said computer is further programmed to perform the steps of interrogating said battery to obtain said design charge capacity, said full charge capacity and said current charge capacity.

14. The apparatus as recited in claim 10, wherein said first indicator comprises a portion of a dashed rectangle, said second indicator comprises a portion of a solid rectangle and said third indicator comprises a filled-in rectangle.

15. A patient monitor incorporating an apparatus as recited in claim 10.

16. A method of displaying a gauge representing the state of a battery, comprising the steps of:

calculating electronic data representing a gauge comprising a first indicator representing a design charge capacity of a battery and a second indicator representing a full charge capacity of said battery; and displaying said electronic data on a display panel.

17. The method as recited in claim 16, wherein said gauge represented by said electronic data further comprises a third indicator representing a current charge capacity of said battery.

18. The method as recited in claim 17, wherein said first indicator comprises a portion of a dashed rectangle, said second indicator comprises a portion of a solid rectangle and said third indicator comprises a filled-in rectangle.

19. The method as recited in claim 17, wherein said gauge comprises a bar graph, said first indicator comprises a dashed line on said bar graph, said second indicator comprises a solid line on said bar graph and said third indicator comprises a filled-in rectangle on said bar graph.

20. The method as recited in claim 16, further comprising the step of interrogating said battery to acquire said design and full charge capacities.

21. The method as recited in claim 16, wherein said calculating step comprises the steps of:

determining a first number of pixels roughly proportional to said design charge capacity of said battery;

determining a second number of pixels roughly proportional to said full charge capacity of said battery; and determining a third number of pixels roughly proportional to said current charge capacity of said battery, and said displaying step comprises the step of displaying said first indicator separated from a baseline by said first number of pixels, said second indicator separated from said baseline by said second number of pixels, and said third indicator separated from said baseline by said third number of pixels.

22. An apparatus comprising:

a smart battery comprising a battery and memory for storing a first value representing a design charge capacity and a second value representing a full charge capacity of said battery; and means for interrogating said battery to acquire said design and full charge capacities; and means for displaying a gauge comprising a first indicator representing said first value and a second indicator representing said second value.

23. A portable instrument comprising:

a battery having a design charge capacity and a full charge capacity;

a data acquisition subsystem powered by said battery;

a display screen for displaying data acquired by said data acquisition subsystem; and means for displaying a fuel gauge icon on said display screen, said fuel gauge icon comprising a first indicator representing said design charge capacity and a second indicator representing said full charge capacity.

* * * * *